United States Patent
Aota

(10) Patent No.: US 7,994,707 B2
(45) Date of Patent: Aug. 9, 2011

(54) ORGANIC EL DEVICE AND METHOD OF PRODUCING THE DEVICE

(75) Inventor: Yukito Aota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 274 days.

(21) Appl. No.: 12/193,620

(22) Filed: Aug. 18, 2008

(65) Prior Publication Data

US 2009/0058275 A1 Mar. 5, 2009

(30) Foreign Application Priority Data

Aug. 28, 2007 (JP) ................................ 2007-220813

(51) Int. Cl.
*H01L 51/50* (2006.01)
(52) U.S. Cl. ........... 313/504; 313/512; 445/25; 428/690
(58) Field of Classification Search .................. 313/504, 313/506, 512; 445/25; 315/169.3; 428/690
See application file for complete search history.

(56) References Cited

U.S. PATENT DOCUMENTS

| | | | | |
|---|---|---|---|---|
| 2001/0045565 A1* | 11/2001 | Yamazaki | ....................... | 257/89 |
| 2003/0164677 A1* | 9/2003 | Miyaguchi et al. | ........... | 313/504 |
| 2004/0178725 A1 | 9/2004 | Karasawa et al. | ............. | 313/506 |
| 2005/0206304 A1* | 9/2005 | Kim | .............................. | 313/504 |
| 2005/0248272 A1* | 11/2005 | Koike et al. | .................... | 313/512 |

FOREIGN PATENT DOCUMENTS

| | | |
|---|---|---|
| JP | 2000-077183 | 3/2000 |
| JP | 2002-134268 | 5/2002 |
| JP | 2004-252406 | 9/2004 |

* cited by examiner

*Primary Examiner* — Nimeshkumar Patel
*Assistant Examiner* — Mary Ellen Bowman
(74) *Attorney, Agent, or Firm* — Fitzpatrick, Cella, Harper & Scinto

(57) ABSTRACT

Provided is an organic EL device including a substrate, a lower electrode, an organic compound layer containing one of an alkali metal and an alkali metal compound, an upper electrode formed of an oxide film, and passivation layers for covering the lower electrode, the organic compound layer, and the upper electrode, the lower electrode, the organic compound layer, the upper electrode, and the passivation layers being stacked in the stated order on the substrate, in which the passivation layers include a first passivation layer formed on the upper electrode, which contains silicon as a main component, and which is free of hydrogen and a second passivation layer formed on the first passivation layer which contains silicon as a main component and hydrogen.

4 Claims, 4 Drawing Sheets

ORGANIC EL DEVICE AND METHOD OF PRODUCING THE DEVICE

BACKGROUND OF THE INVENTION

1. Field of the Invention

The present invention relates to an organic electroluminescence (EL) device for use in, for example, a flat panel display, and a method of producing the device.

2. Description of the Related Art

An organic EL device being a self light-emitting device as a flat panel display has been recently attracting attention. The organic EL device is liable to cause the degradation of characteristics owing to moisture or oxygen, the organic compound layer is peeled from an electrode layer owing to a trace amount of moisture, and the peeling is responsible for the occurrence of a dark spot. In view of the foregoing, the organic EL device is covered with an etching glass cover, a sealing agent is used to bond the periphery of the resultant, and the inside of the resultant is attached with a moisture absorbent so that moisture infiltrating from a sealing surface is absorbed by the moisture absorbent. As a result, the lifetime of the organic EL device is secured.

However, the realization of a space-saving flat panel display owing to thin organic EL device requires elimination of the space for the moisture absorbent around a light-emitting area, further reduction of thickness and thus employment of a sealing method for the organic EL device without the need for a large amount of the moisture absorbent. As a result, solid sealing with a high-performance passivation layer is demanded to prevent moisture or oxygen from entering into the organic compound layer.

For solving those problems, in recent years, as a passivation layer for an organic EL device, solid sealing with an oxidized silicon nitride film using a CVD or sputtering method and a passivation layer prepared by laminating a ceramic and an organic film has been proposed.

Japanese Patent Application Laid-Open No. 2000-077183 proposes an organic EL device sealed with a passivation layer formed of a silicon nitride film by employing a plasma CVD method.

Japanese Patent Application Laid-Open No. 2002-134268 proposes a technology for a passivation layer formed of a silicon nitride film formed with a CVD method.

Further, Japanese Patent No. 3705282 proposes a technology for forming, on a device containing cesium added to an interface between an electron injection layer and an adjacent layer, a silicon nitride film or a sealing film formed of an ITO material formed by a vapor deposition method.

In general, an organic EL device is formed of an anode, an organic compound layer formed of a hole transport layer, an emission layer, an electron transport layer and an electron injection layer, a cathode, and a passivation layer for protecting these layers from moisture. In addition, the electron injection layer of the organic EL device contains an alkali metal or alkali metal compound formed by the co-vapor deposition of an organic compound material and an alkali metal compound. The electron injection layer having an alkali metal is formed as described above so that the efficiency with which an electron is injected from the layer is improved.

However, the cluster of the alkali metal compound adheres to the inside of the organic EL device upon co-vapor deposition of the alkali metal compound and the organic compound material.

The cathode of an oxide film formed of, for example, an indium tin oxide alloy (ITO), an indium zinc oxide alloy (IZO) or an indium tin zinc oxide alloy (ITZO) is formed on the electron injection layer. When the passivation layer is further formed on the cathode by using hydrogen or a material gas containing hydrogen, a void occurs on the device. The void is of a size of about several micrometers to several tens of micrometers. Further, the void may swell to burst. Such void often produces, in the passivation layer, a crack serving as a path through which moisture infiltrates, and is hence responsible for the generation of a dark spot in the organic EL device.

As described above, Japanese Patent No. 3705282 proposes a technology for forming, on an organic EL device containing cesium added to an interface between an electron injection layer and an adjacent layer, a passivation layer formed of a silicon nitride film or an ITO film with a vapor deposition method. However, foreign matter such as a cluster generated upon formation of the organic compound layer of the organic EL device by vapor deposition or the etching residue of a device isolation film adheres onto the organic EL device. The passivation layer formed of a silicon nitride film or an ITO film formed with a vapor deposition method or a sputtering method is a hard film having insufficient coverage performance, so the layer cannot completely cover the above foreign matter when the layer is formed on the foreign matter. In addition, an increase in thickness of the layer involves, for example, the following problems: a crack is generated in the layer as a sealing film, or the sealing film splinters. Accordingly, the layer does not suffice for the prevention of the infiltration of moisture or oxygen into the device.

SUMMARY OF THE INVENTION

An object of the present invention is to provide an organic EL device having the following characteristics and a method of producing the device: voids generated in a production process for the organic EL device can be suppressed, and the infiltration of moisture or oxygen into the organic compound layer of the organic EL device can be prevented.

The organic EL device of the present invention for solving the above problems, includes: a substrate; a lower electrode; an organic compound layer containing one of an alkali metal and an alkali metal compound; an upper electrode formed of an oxide film; and passivation layers for covering the lower electrode, the organic compound layer and the upper electrode; the lower electrode, the organic compound layer and the upper electrode and the passivation layers being stacked in the stated order on the substrate, in which the passivation layers include a first passivation layer formed on the upper electrode, which contains silicon as a main component and which is free of hydrogen and a second passivation layer formed on the first passivation layer which contains silicon as a main component and hydrogen.

According to the present invention, voids generated in a production process for an organic EL device can be suppressed, and the infiltration of moisture or oxygen into the organic compound layer of the organic EL device can be prevented.

Further features of the present invention will become apparent from the following description of exemplary embodiments with reference to the attached drawings.

DESCRIPTION OF THE EMBODIMENTS

Figure 1:
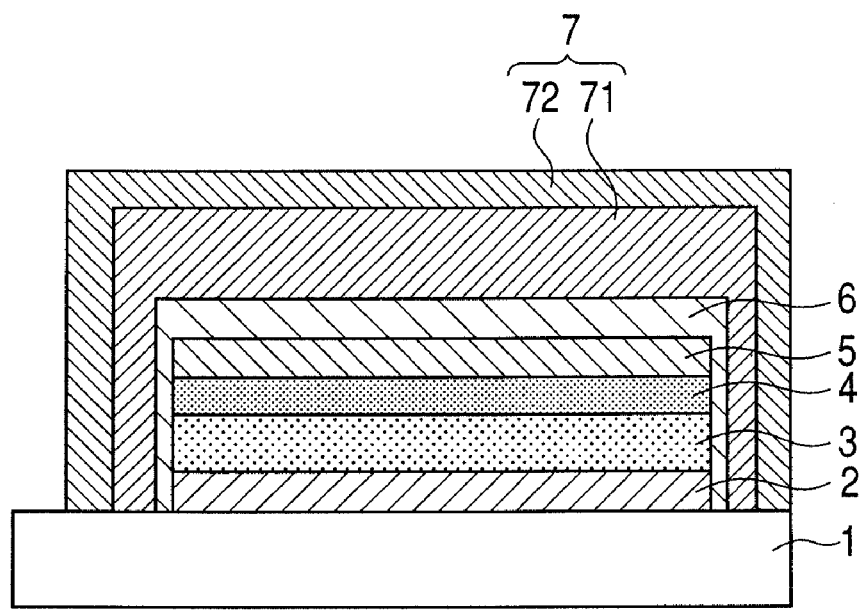
FIG. 1 is a sectional view schematically illustrating an organic EL device of the present invention.

The story behind the fact that the inventors have reached the present invention will be described first, and then an organic EL device of the present invention and a method of producing the device will be described in detail.

In the case of an organic EL device having an electron injection layer doped with an alkali metal or an alkali metal compound, upon co-vapor deposition of an organic compound and an alkali metal compound, the cluster of the alkali metal compound often adheres to the deposited surface of the organic EL device. An upper electrode is formed on the electron injection layer. However, when the upper electrode has a small thickness, the electrode cannot cover the above cluster, and may not suffice for the prevention of the passage of water. Accordingly, in the case of an organic EL device obtained by forming an upper electrode formed of an oxide on an electron injection layer containing an alkali metal or an alkali metal compound, the formation of a passivation layer on the upper electrode generates voids in the organic EL device. The reason why the voids are generated is probably as described below. When a material gas to be used upon formation of the passivation layer contains hydrogen, a generated hydrogen ion or radical draws oxygen of the oxide as a ground to produce water or an OH group. The water or OH group enters the device from a gap of the upper electrode to react with a cluster containing a large amount of the alkali metal or the alkali metal compound, so hydrogen is generated on the basis of, for example, a reaction represented by the following formula (1). The hydrogen forms the voids.

$$2CS + 2H_2O \rightarrow 2Cs(OH) + H_2 \quad (1)$$

When the alkali metal or the alkali metal compound, especially cesium or a cesium compound having high reactivity with moisture is used as a dopant for the electron injection layer, the sizes of voids and the ratio at which the voids are generated increase. Further, when cesium carbonate is used as a co-vapor deposition material upon doping of the electron injection layer with cesium or the cesium compound, the sizes of the voids and the ratio at which the voids are generated particularly increase.

A first passivation layer is formed on the upper electrode of the organic EL device so as to protect hydrogen in the film, and a hydrogen ion and a radical in plasma in the electrode. The inventor of the present invention considers that the formation of a second passivation layer having high coverage performance and high moisture resistance on the first passivation layer will be able to realize passivation layers capable of suppressing the generation of voids.

Accordingly, the first passivation layer is a passivation layer free of hydrogen produced with a method generating neither a hydrogen ion nor a radical so that hydrogen and a hydrogen ion or radical did not form voids. In addition, in the case of a passivation layer containing hydrogen, an increase in hydrogen content of the layer increases the number and sizes of holes in the layer so that the layer shows good covering against foreign matter, and the increase improves the planarizing performance and coverage performance of the layer. Further, a decrease in hydrogen content of the layer causes the holes in the layer to show a tendency reverse to that described above, thereby improving the moisture resistance of the layer. Accordingly, the second passivation layer desirably contains hydrogen.

Hereinafter, embodiments of the organic EL device of the present invention will be described with reference to drawings along a method of producing the device. However, the present invention is not limited to these embodiments.

FIGS. 1 to 6 are each an exemplary conceptual view illustrating part of the section of the organic EL device of the present invention. In the figures, reference numeral 1 represents a substrate; 2, a lower electrode; 3, an organic compound layer (hole injection layer/emission layer/electron transport layer); 4, an electron injection layer; 5, an upper electrode; 6, a first passivation layer; 7, a second passivation layer; 8, a circularly polarizing plate; 61, a first layer of the first passivation layer; 62, a second layer of the first passivation layer; 71, a first layer of the second passivation layer; and 72, a second layer of the second passivation layer.

First, the substrate 1 is formed by laminating a TFT, an insulating film, and an organic planarization film (none of which is shown) in the stated order on a glass substrate. A Cr electrode as the lower electrode 2 of a pixel unit is formed on the substrate 1. The periphery of each pixel is covered with a device isolation film (not shown) formed of an insulating material such as polyimide or silicon nitride. The lower electrode 2 may be a stacked member of aluminum or silver and an oxide film formed of, for example, IZO or ITO.

The organic compound layer 3 formed of the hole transport layer, the emission layer, and the electron transport layer, and an organic compound layer formed of the electron injection layer 4 are sequentially formed on the substrate 1. Doping the electron injection layer 4 with an alkali metal or an alkali metal compound can improve the efficiency with which an electron is injected from the layer.

Cesium or a cesium compound can be used as the alkali metal or the alkali metal compound. Here, the cesium compound is at least one selected from the group consisting of cesium carbonate, a substance derived from cesium carbonate such as cesium suboxide, and a coordination compound in which cesium coordinates with an organic compound in the organic compound layer.

In other words, the electron injection layer 4 is formed by the co-vapor deposition of a metal such as sodium, lithium, potassium, rubidium, cesium, or francium or a compound of any such metal and the organic compound. In this embodiment, the electron injection layer 4 is formed by co-depositing cesium carbonate as a cesium compound and an electron transportable material so that the content of the cesium compound was 0.1% to several tens of %. The thickness of the electron injection layer 4 is preferably 10 to 100 nm in order that the layer may secure good electron injection property.

The upper electrode 5 is formed on the electron injection layer 4. The upper electrode 5 is formed of an indium zinc oxide alloy (IZO). Alternatively, the electrode may be formed of an oxide film having a high transmittance such as an indium tin oxide alloy (ITO) and an indium tin zinc oxide alloy (ITZO).

The first passivation layer 6 is formed on the upper electrode 5. In this embodiment, as shown in FIG. 1, the first passivation layer 6 is formed so as to cover the organic compound layer 3, the electron injection layer 4, the upper electrode 5, and, furthermore, the organic planarization film except an extraction electrode (not shown).

The first passivation layer 6 is desirably a film free of hydrogen and having a high transmittance, and furthermore, is preferably a film having high moisture resistance. For example, the first passivation layer 6 is formed of one or more insulating films each formed of one of an oxide, a nitride, and an oxynitride. That is, the first passivation layer 6 can be formed of a film formed of silicon oxide, silicon nitride, or silicon oxynitride with a sputtering method by flowing nitrogen, oxygen, or a mixed gas of nitrogen and oxygen, and an argon gas. Alternatively, the layer can be formed by employing a vapor deposition method or an ion plating method as well. In this embodiment, the layer is formed of: a single layer formed of silicon oxide or silicon nitride; or plural layers each formed of silicon oxide or silicon nitride. Silicon oxide is formed with a DC sputtering method by using a silicon target as a material while flowing only oxygen and argon as material gases. In addition, silicon nitride is formed with a DC sputtering method by using a silicon target as a material while flowing only nitrogen and argon as material gases.

The larger the thickness of the first passivation layer 6, the more effective the layer.

The second passivation layer 7 is formed on the first passivation layer 6. In this embodiment, as shown in FIG. 1, the second passivation layer 7 is formed so as to cover the first passivation layer 6.

The second passivation layer 7 covers foreign matter on the organic EL device, the device isolation film of the substrate, and the irregularities of the electrodes to block moisture from the outside of the device. In this embodiment, the second passivation layer 7 is formed to have a two-layer constitution.

The first layer 71 of the second passivation layer 7 is formed of silicon oxynitride, silicon oxide, or silicon nitride with a CVD method. To be specific, plasma CVD, radical shower (RS)-CVD, Cat-CVD, photo CVD, or thermal CVD is an effective method for the production of the layer. An organic silane gas as well as monosilane ($SiH_4$), disilane ($Si_2H_6$), nitrogen, ammonia, nitrous oxide, oxygen, or the like can be used as a material gas. Examples of a usable organic silane gas include, but not limited to, tetraethoxysilane (TEOS), trimethoxysilane (TMS), and octamethylcyclotetrasiloxane (OMCTS). In addition, a gas such as hydrogen or argon is used as an auxiliary material gas.

The second layer 72 of the second passivation layer 7 is desirably formed of silicon oxide, silicon oxynitride, silicon nitride, or diamond-like carbon (DLC); in particular, the layer is preferably formed of silicon nitride because silicon nitride has high moisture resistance. A plasma CVD method, a radical shower (RS)-CVD method, a Cat-CVD method, a photo CVD method, a sputtering method, or a vapor deposition method is an effective method for the production of the layer.

According to the present invention, in the organic EL device having the electron injection layer containing the alkali metal or the alkali metal compound, the first passivation layer 6 formed on the upper electrode 5 of an oxide film was formed of a material free of hydrogen, and the second passivation layer 7 is formed on the layer. As a result, the generation of voids in the organic EL device upon formation of the second passivation layer 7 without the first passivation layer 6 can be prevented.

Therefore, the present invention exerts an enormous preventing effect on the deterioration of the organic EL device and the generation of dark spots because no voids are generated, the generation of a crack in the second passivation layer 7 can be suppressed, and hence the infiltration of moisture or oxygen into the organic compound layer of the device can be prevented.

Figure 2:
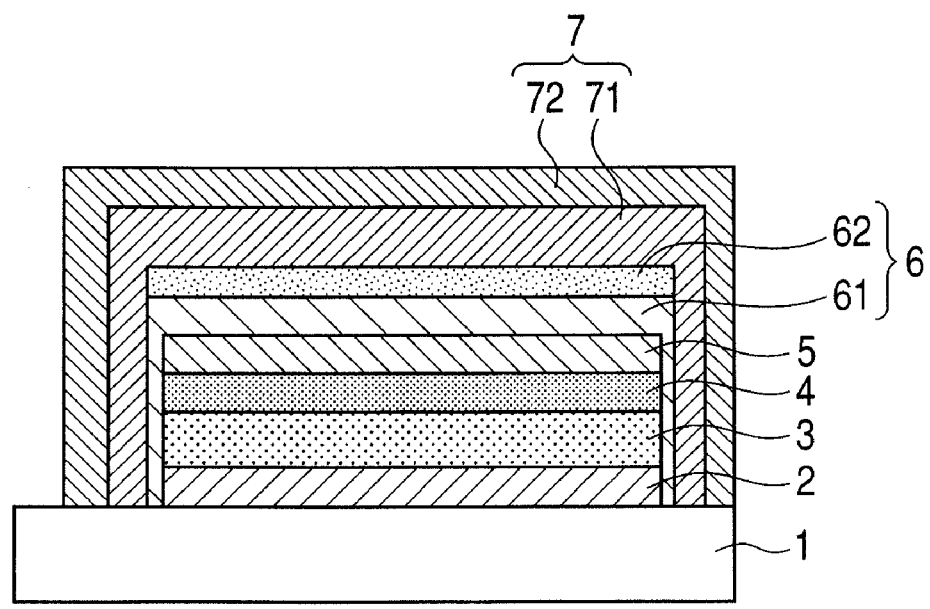
FIG. 2 is a sectional view schematically illustrating another organic EL device of the present invention.

In the above embodiment, the first passivation layer 6 is formed to have a one-layer constitution. However, the constitution is not limited to the foregoing. The layer may be formed to have a two-layer constitution as shown in FIG. 2.

Figure 3:
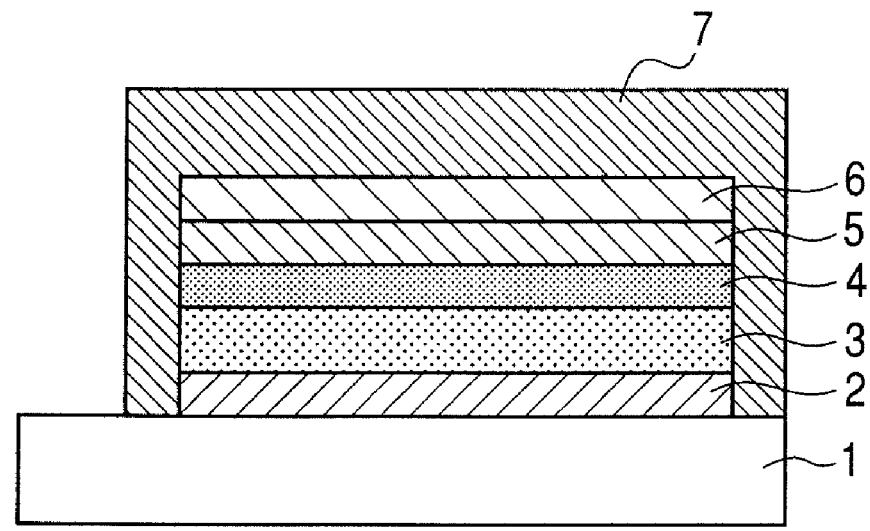
FIG. 3 is a sectional view schematically illustrating another organic EL device of the present invention.
Figure 4:
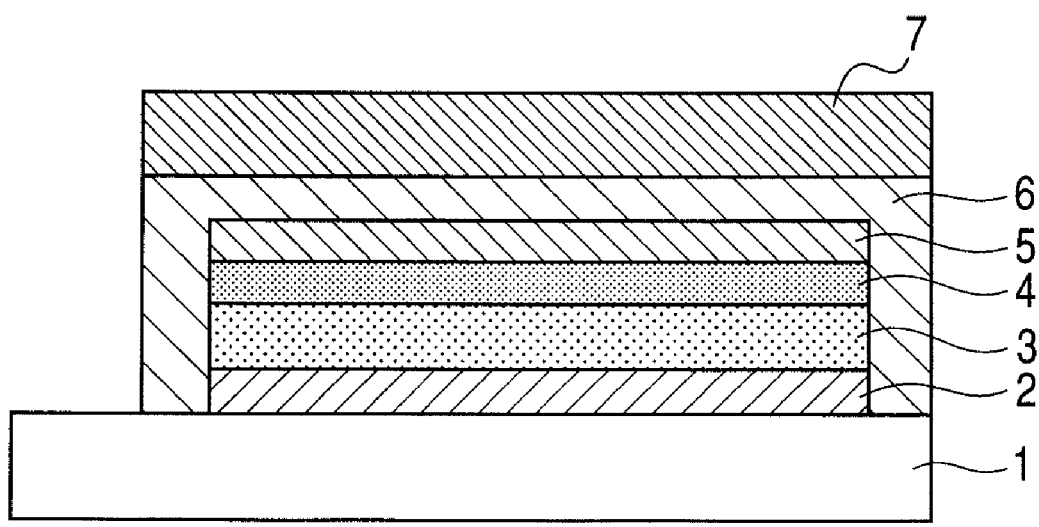
FIG. 4 is a sectional view schematically illustrating another organic EL device of the present invention.

In the above embodiment, the first passivation layer 6 is formed so as to cover the organic compound layer 3, the electron injection layer 4, the upper electrode 5 and the organic planarization film. However, the manner in which the layer is formed is not limited to the foregoing. As shown in FIG. 3, the first passivation layer 6 is not requested to cover the entire exposed surface of the upper electrode 5, and has only to cover the electron injection layer 4. Alternatively, as shown in FIG. 4, the first passivation layer 6 may be formed so as to be exposed from the second passivation layer 7.

It should be noted that a film or a glass plate can be bonded onto the second passivation layer 7 with, for example, an adhesive. As shown in each of FIGS. 5 and 6, bonding the circularly polarizing plate 8 directly on the second passivation layer 7 is effective in reducing the thickness of the organic EL device.

Examples of the present invention are now described in the following.

Example 1

The generation of voids in the organic EL device of the present invention shown in FIG. 1 is evaluated.

The substrate 1 having a constitution shown in FIG. 1 is formed by stacking a TFT, an insulating film, and an organic planarization film (none of which is shown) in the stated order on a glass substrate. The lower electrode 2 formed of chromium is formed on the substrate, and furthermore, the periphery of the electrode is insulated with a device isolation film formed of polyimide (not shown).

First, the above substrate 1 was baked in a vacuum baking furnace at 200° C. for 4 hours. After that, the pressure in the vacuum baking furnace was returned to atmospheric pressure, and the substrate was taken out of the vacuum baking furnace and conveyed. Next, the substrate was placed in a baking chamber. The chamber was evacuated to a degree of vacuum of $1\times10^{-4}$ Pa, and the substrate was baked at 150° C. for 10 minutes. The substrate 1 was conveyed to a UV chamber. The pressure in the UV chamber was set to atmospheric pressure with dry air, and the substrate was subjected to UV/ozone cleaning. A vapor deposition chamber was evacuated to a degree of vacuum of $1\times10^{-4}$ Pa, and the substrate 1 was conveyed to the chamber. After that, an organic EL device was produced while a vacuum was maintained during a process commencing on a step of depositing the organic compound layer from the vapor to ending on the completion of the formation of the second passivation layer 7.

In the vapor deposition step, the hole transport layer, the emission layer, and the electron transport layer were deposited from the vapor in the stated order onto the lower electrode 2 formed of Cr of the above substrate 1 to form the organic compound layer 3, and furthermore, the electron injection layer 4 was deposited from the vapor onto the layer. The vapor deposition chamber was mounted with materials and evacuated to a degree of vacuum of the order of $1\times10^{-4}$ Pa in advance. After the substrate had been conveyed to the vapor deposition chamber, N,N'-α-dinaphthylbenzidine (α-NPD) was formed into a film having a thickness of 40 nm on the lower electrode 2, whereby a hole transport layer was formed.

A co-vapor deposition film of a coumarin dye (1.0 vol %) which is known to emit green light and tris-[8-hydroxyquinolinate] aluminum (Alq$_3$) together was formed thereon to have a thickness of 30 nm to thereby form an emission layer.

Then, as the electron transport layer, a film of a phenanthroline compound represented by the following formula was formed to have a thickness of 10 nm.

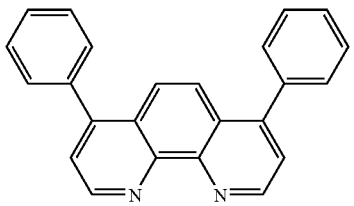

A co-vapor deposition film of cesium carbonate (2.9 vol %) and the phenanthroline compound represented by the above formula was formed on the electron transport layer to have a thickness of 40 nm to thereby obtain the electron injection layer 4.

Next, the substrate 1 having the layers up to the electron injection layer 4 was conveyed to a sputtering chamber, where a film of indium tin oxide (ITO) was formed by DC sputtering on the electron injection layer 4 to have a thickness of 60 nm to thereby obtain the upper electrode 5.

The substrate 1 was conveyed to another sputtering chamber, and silicon nitride was formed into a film having a thickness of 240 nm on the substrate with a DC sputtering method by using a silicon material as a target while nitrogen and an argon gas were flowed and the pressure at which the film was formed was adjusted to 0.8 Pa, whereby the first passivation layer 6 was obtained.

The substrate 1 was conveyed to a CVD chamber, and a monosilane gas, a nitrous oxide gas, a nitrogen gas and a hydrogen gas were flowed so that the pressure of a space where a reaction was performed was controlled to 100 Pa. Then, 60-MHz high-frequency power was supplied to a high-frequency electrode, and the first layer 71 of the second passivation layer 7 formed of a silicon oxynitride film having a thickness of about 2 μm was deposited and formed.

The monosilane gas, the nitrogen gas and the hydrogen gas were continuously flowed so that the pressure of the space where a reaction was performed was controlled to 100 Pa. Then, 60-MHz high-frequency power was supplied to the high-frequency electrode, and the second layer 72 of the second passivation layer 7 formed of a silicon nitride film having a thickness of about 1 μm was deposited and formed.

After that, the device was evaluated for the generation of voids with an optical microscope manufactured by OLYMPUS CORPORATION (with an objective lens at a magnification of 5 to 20). The voids swell like hemispheres to serve as dark spots. When a void size is large, a crack is generated in the passivation layer 7, and a dark spot expands owing to moisture permeation. In Example 1, no dark spots due to hemispherical voids each having a diameter of 2 μm or more were observed.

Example 2

In Example 2, an organic EL device shown in FIG. 1 was produced while silicon oxide was used in the first passivation layer 6 and the thickness of the first passivation layer 6 was changed.

The same substrate as that of Example 1 was used, and a process commencing on vacuum baking to ending on the formation of the upper electrode was the same as that of Example 1.

The substrate was conveyed to another sputtering chamber, and silicon oxide was formed into a film having on the substrate with a DC sputtering method while oxygen and an argon gas were flowed and the pressure at which the film was formed was adjusted to 0.8 Pa, whereby the first passivation layer 6 was obtained.

The second passivation layer 7 was formed in the same manner as in Example 1.

The above process was repeated so that three organic EL devices in each of which the thickness of the first passivation layer 6 was 50 nm, three organic EL devices in each of which the thickness of the layer was 80 nm, three organic EL devices in each of which the thickness of the layer was 150 nm, and three organic EL devices in each of which the thickness of the layer was 250 nm were produced.

The devices were each evaluated for the generation of voids with an optical microscope (with an objective lens at a magnification of 5 to 20) in the same manner as in Example 1.

Table 1 shows the results of the evaluation.

TABLE 1

| Thickness (nm) | Maximum void size (μm) | Average number of voids (voids) |
|---|---|---|
| 50 | 15 | 18 |
| 80 | 10 | 8 |
| 150 | 5 | 4 |
| 250 | — | 0 |

A thickness shown in Table 1 refers to the thickness of the first passivation layer.

A void diameter shown in the table refers to the diameter of the largest void in each organic EL device, and the number of voids each having a diameter of 2 μm or more was obtained by averaging those of the three organic EL devices.

When the first passivation layer 6 was formed to have a thickness of 50 nm, the maximum void size was about 15 μm, and the number of voids was 18.

When the first passivation layer 6 was formed to have a thickness of 80 nm, the maximum void size was reduced to about a little less than 10 μm, and the number of voids was reduced to 8.

When the first passivation layer 6 was formed to have a thickness of 150 nm, the maximum void size was about 5 μm; voids were further reduced in size. In addition, the number of voids was reduced to 4.

When the first passivation layer 6 was formed to have a thickness of 250 nm, the void size of each void was 2 μm or less.

As described above, the obtained result is as follows: a significant reducing effect on the number of voids is achieved when the thickness of the first passivation layer 6 is set to 80 nm or more. In addition, when the first passivation layer 6 was formed to have a thickness of 250 nm, no voids each having a diameter of 2 μm or more were observed.

Example 3

In Example 3, an organic EL device shown in FIG. 2 was produced while silicon oxide was used in the first layer 61 of the first passivation layer 6, silicon nitride was used in the second layer 62 of the layer, and the thickness of each of the first and second layers was changed.

The same substrate 1 as that of Example 1 was used, and a process commencing on vacuum baking to ending on the formation of the upper electrode 2 was the same as that of Example 1.

The substrate 1 was conveyed to another sputtering chamber, and silicon oxide was formed into a film on the substrate with a DC sputtering method by using a target formed of silicon while oxygen and an argon gas were flowed and the pressure at which the film was formed was adjusted to 0.8 Pa, whereby the first layer 61 of the first passivation layer 6 was obtained.

The substrate 1 was conveyed to another sputtering chamber, and silicon nitride was formed into a film on the substrate with a DC sputtering method by using a target formed of silicon while nitrogen and an argon gas were flowed and the pressure at which the film was formed was adjusted to 0.7 Pa, whereby the first layer 62 of the first passivation layer 6 was obtained.

The second passivation layer 7 was formed in the same manner as in Example 1.

The above process was repeated so that respective three organic EL devices in each of which the first and second layers each had a thickness shown in Table 2 were produced as in the case of Example 2.

The devices were each evaluated for the generation of voids with an optical microscope in the same manner as in Example 1. Table 2 shows the results of the evaluation.

TABLE 2

| Thickness of the first layer (nm) | Thickness of the second layer (nm) | Maximum void size (μm) | Average number of voids (voids) |
|---|---|---|---|
| 50 | 50 | 9 | 5 |
| 80 | 50 | 3 | 2 |
| 150 | 50 | — | 0 |
| 250 | 50 | — | 0 |

A thickness shown in Table 2 refers to the thickness of the first layer or the second layer of the first passivation layer.

When the first layer 61 of the first passivation layer 6 was formed to have a thickness of 80 nm and the second layer 62 of the first passivation layer 6 was formed to have a thickness of 50 nm, the maximum void size fell below 10 μm at maximum, and the number of voids was 5.

When the first layer 61 of the first passivation layer 6 was formed to have a thickness of 80 nm and the second layer 62 of the first passivation layer 6 was formed to have a thickness of 50 nm, the maximum void size was reduced to as small as about 3 μm, and the number of voids was reduced to 2.

When the first layer 61 of the first passivation layer 6 was formed to have a thickness of 150 nm and the second layer 62 of the first passivation layer 6 was formed to have a thickness of 50 nm, no voids each having a diameter of 2 μm or more were observed.

When the first layer 61 of the first passivation layer 6 was formed to have a thickness of 250 nm and the second layer 62 of the first passivation layer 6 was formed to have a thickness of 50 nm, no voids each having a diameter of 2 μm or more were observed either.

As described above, the formation of the second layer 62 of the first passivation layer 6 from silicon nitride had a significant reducing effect on the number of voids. In addition, when the stacked thickness of the first passivation layer 6 was 200 nm or more, no voids each having a diameter of 2 μm or more were observed.

Example 4

In Example 4, an organic EL device shown in FIG. 1 was produced while silicon nitride was used in the first passivation layer 6, and the thickness of each of the first and second layers was changed.

The same substrate 1 as that of Example 1 was used, and a process commencing on vacuum baking to ending on the formation of the upper electrode 5 was the same as that of Example 1.

In Example 4, the substrate 1 was conveyed to an ion beam sputtering apparatus with a vacuum returnable case, and silicon nitride was formed into a film on the substrate with an ion beam sputtering method while a nitrogen gas was flowed, whereby the first passivation layer 6 was obtained.

The substrate 1 was conveyed to a CVD chamber with a vacuum returnable case, and a monosilane gas, an ammonia gas, and a nitrogen gas were flowed so that the pressure of a space where a reaction was performed was controlled to 100 Pa. Then, 60-MHz high-frequency power was supplied to a high-frequency electrode, and the second layer 72 of the second passivation layer 7 formed of a silicon nitride film having a thickness of about 1 μm was deposited and formed.

The monosilane gas, the nitrogen gas, and the hydrogen gas were continuously flowed so that the pressure of the space where a reaction was performed was controlled to 100 Pa. Then, 60-MHz high-frequency power was supplied to the high-frequency electrode, and the second layer 72 of the second passivation layer 7 formed of a silicon nitride film having a thickness of about 1 μm was deposited and formed.

Similarly, the above process was repeated so that three organic EL devices in each of which the first passivation layers each had a thickness shown in Table 3 were produced as in the case of Example 2.

The devices were each evaluated for the generation of voids with an optical microscope in the same manner as in Example 1. Table 3 shows the results of the evaluation.

TABLE 3

| Thickness (nm) | Maximum void size (μm) | Average number of voids (voids) |
|---|---|---|
| 50 | 15 | 17 |
| 80 | 8 | 6 |
| 150 | 3 | 2 |
| 250 | — | 0 |

A thickness shown in Table 3 refers to the thickness of the first passivation layer.

When the first passivation layer 6 was formed to have a thickness of 50 nm, the maximum void size was about 15 μm, and the number of voids was 17.

When the first passivation layer 6 was formed to have a thickness of 80 nm, the maximum void size was reduced to about a little more than 8 μm at maximum, and the number of voids was reduced to 6.

When the first passivation layer 6 was formed to have a thickness of 150 nm, the maximum void size was about 3 μm and voids were further reduced in size. In addition, the number of voids was reduced to 2.

When the first passivation layer 6 was formed to have a thickness of 250 nm, no voids each having a diameter of 2 μm or more were observed.

As described above, the formation of the first passivation layer 6 from silicon nitride reduces the number of voids. Further, when the thickness of the first passivation layer 6 was 80 μm or more, a significant reducing effect on the number of voids was obtained.

Example 5

Figure 6:
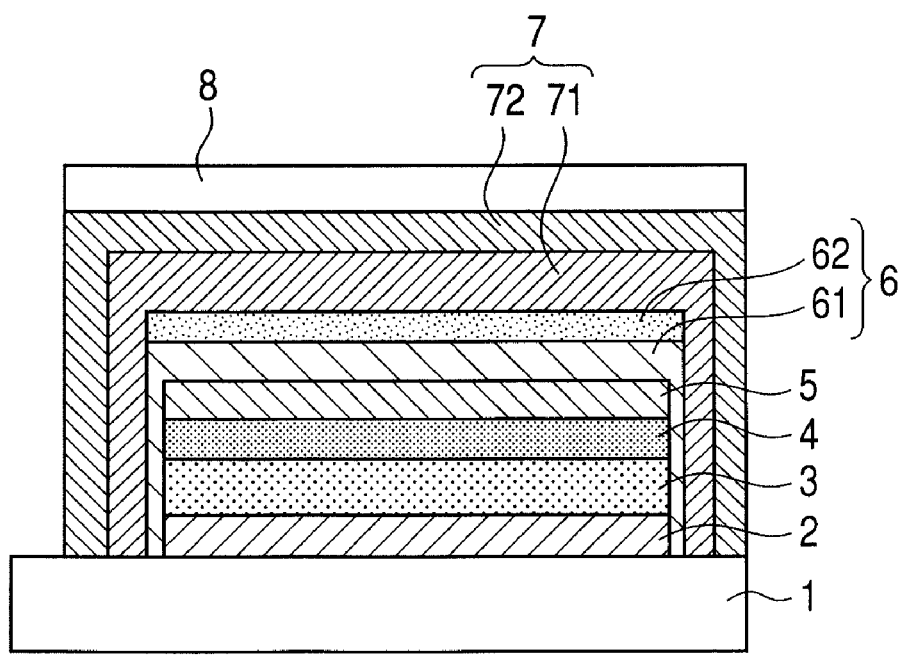
FIG. 6 is a sectional view schematically illustrating another organic EL device of the present invention.

In Example 5, an organic EL device shown in FIG. 6 was produced.

The same substrate 1 as that of Example 1 was used, and a process commencing on vacuum baking to ending on the formation of the upper electrode 5 was the same as that of Example 1.

The substrate was conveyed to an ion beam sputtering apparatus with a vacuum returnable case, and silicon oxide was formed into a film on the substrate with an ion beam sputtering method while an oxygen gas was flowed, whereby the first layer 61 of the first passivation layer 6 having a thickness of 100 nm was obtained. Next, the substrate 1 was retracted, and was subjected to pre-sputtering while a nitrogen gas was flowed. After that, the substrate 1 was loaded into the ion beam sputtering apparatus. Subsequently, silicon nitride was formed into a film with an ion beam sputtering method while a nitrogen gas was flowed, whereby the second layer 62 of the first passivation layer 6 having a thickness of 150 nm was obtained.

After that, the substrate 1 was conveyed to a vacuum ultraviolet light CVD apparatus with a vacuum returnable case. Then, the first layer 71 of the second passivation layer 7 having a thickness of about 2 μm, having silicon oxide as a base, and containing a large amount of Si—CH$_3$ was deposited and formed with a vacuum ultraviolet light CVD method by using OMCTS as polysiloxane as a material gas.

The substrate 1 was conveyed to a plasma CVD chamber. Then, a monosilane gas, a nitrogen gas, and a hydrogen gas were flowed so that the pressure of a space where a reaction was performed was controlled to 100 Pa. Next, 60-MHz high-frequency power was supplied to a high-frequency electrode, and the second layer 72 of the second passivation layer 7 formed of a silicon nitride film having a thickness of about 1 μm was deposited and formed.

After that, the circularly polarizing plate 8 was bonded onto the passivation layer.

The initial luminance characteristic of the organic EL device was measured.

The device was evaluated for the generation of voids with an optical microscope in the same manner as in Example 1. In addition, the luminance characteristic of the device was measured.

The maximum void size was about a little less than 2 μm at maximum.

Figure 7:
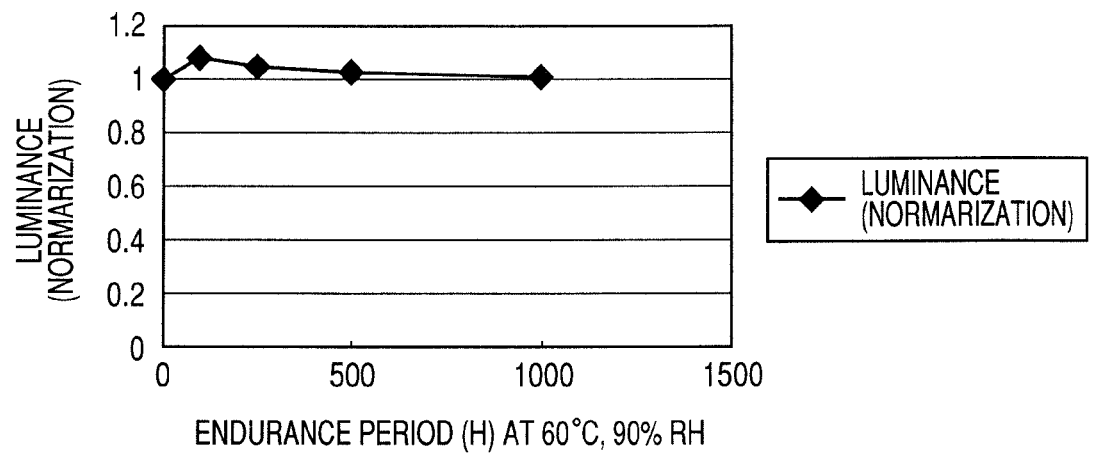
FIG. 7 is a view illustrating the luminance characteristic of the organic EL device of the present invention in Example 5.

Subsequently, the device was loaded into a thermo-hygrostat at 60° C. and 90% RH, and its luminance was measured at a total of 96 hours, 250 hours, 500 hours, or 1,000 hours after the loading. Simultaneously with the measurement, the device was evaluated for the generation of dark spots and its luminance characteristic. FIG. 7 shows the results of the luminance characteristic.

Even after 1,000 hours at 60° C. and 90% RH, no dark spots each having a size in excess of 3 μm were generated. In addition, the luminance characteristic of the device did not deteriorate and the luminance of the device after 1,000 hours was 101% of the initial luminance.

Example 6

Figure 5:
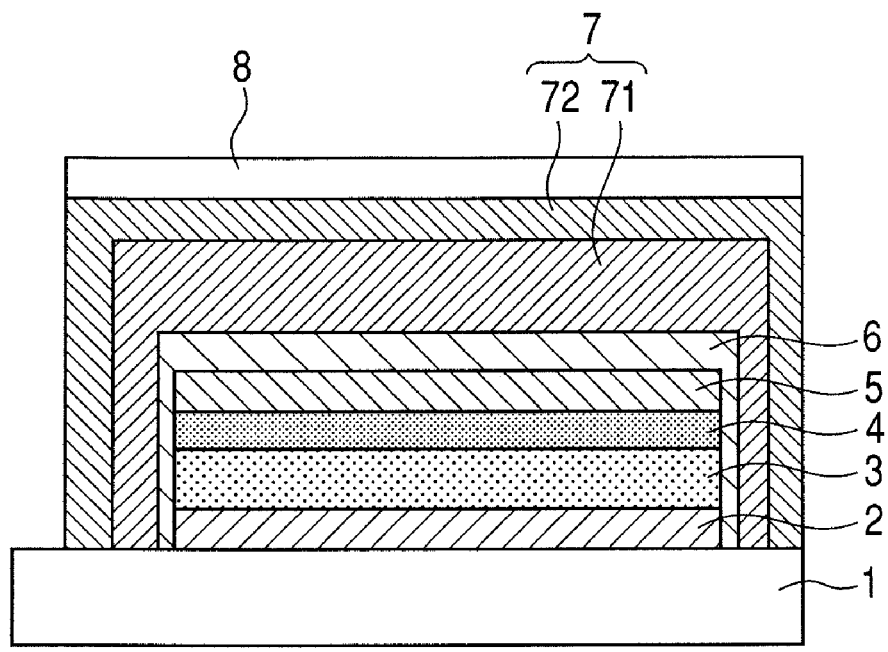
FIG. 5 is a sectional view schematically illustrating another organic EL device of the present invention.

In Example 6, an organic EL device shown in FIG. 5 was produced.

The same substrate 1 as that of Example 1 was used, and a process commencing on vacuum baking to ending on the formation of the upper electrode was the same as that of Example 1.

After that, the substrate 1 was conveyed to an ion beam sputtering apparatus and silicon nitride was formed into a film on the substrate with an ion beam sputtering method while a nitrogen gas was flowed, whereby the first passivation layer 6 having a thickness of 250 nm was obtained.

After that, the substrate 1 was conveyed to a vacuum ultraviolet light CVD apparatus with a vacuum returnable case. Then, the first layer 71 of the second passivation layer 7 having a thickness of about 2 μm, having silicon oxide as a base, and containing a large amount of Si—CH$_3$ was deposited and formed with a vacuum ultraviolet light CVD method by using OMCTS as polysiloxane as a material gas in the same manner as Example 5.

The substrate 1 was conveyed to an ion beam sputtering apparatus, and silicon nitride was formed into a film on the substrate with an ion beam sputtering method while a nitrogen gas was flowed, whereby the second layer 72 of the second passivation layer 7 having a thickness of 250 nm was deposited and formed.

After that, the circularly polarizing plate 8 was bonded onto the passivation layer.

The devices were each evaluated for the generation of voids with an optical microscope in the same manner as in Example 1.

No voids each having a diameter in excess of 2 μm were observed.

Subsequently, the device was loaded into a thermo-hygrostat at 60° C. and 90% RH, and its luminance was measured at a total of 1,000 hours after the loading. Simultaneously with the measurement, the device was evaluated for the generation of dark spots.

Even after 1,000 hours at 60° C. and 90% RH, no dark spots each having a size in excess of 3 μm were generated. In addition, the luminance characteristic of the device did not deteriorate and the luminance of the device after 1,000 hours was 102% of the initial luminance.

Example 7

In Example 7, an organic EL device shown in FIG. 6 was produced.

The same substrate 1 as that of Example 1 was used, and a process commencing on vacuum baking to ending on the formation of the upper electrode was the same as that of Example 1.

Next, the substrate was conveyed to a vapor deposition apparatus, and silicon oxide was formed into a film with an EB vapor deposition method, whereby the first layer 61 of the first passivation layer 6 having a thickness of 100 nm was obtained. Further, the substrate was conveyed to an ion beam sputtering apparatus, and silicon nitride was formed into a film with an ion beam sputtering method, whereby the second layer 62 of the first passivation layer 6 having a thickness of 100 nm was obtained.

After that, the substrate was conveyed to a radical shower CVD apparatus, and the first layer 71 of the second passivation layer 7 having a thickness of about 2 μm and formed of silicon nitride was deposited and formed with a radical shower CVD method by using a monosilane gas and an ammonia gas as material gases.

The substrate was transferred to a Cat-CVD apparatus, and a monosilane gas, an ammonia gas, and a hydrogen gas were flowed, whereby the second layer 72 of the second passivation layer 7 formed of a silicon nitride film having a thickness of about 1 μm was deposited and formed.

After that, the circularly polarizing plate 8 was bonded onto the passivation layer.

The devices were each evaluated for the generation of voids with an optical microscope in the same manner as in Example 1.

No voids each having a diameter in excess of 2 μm were observed.

Subsequently, the device was loaded into a thermo-hygrostat at 60° C. and 90% RH, and its luminance was measured at a total of 1,000 hours after the loading. Simultaneously with the measurement, the device was evaluated for the generation of dark spots.

Even after 1,000 hours at 60° C. and 90% RH, no dark spots each having a size in excess of 3 μm were generated. In addition, the luminance characteristic of the device did not deteriorate and the luminance of the device after 1,000 hours was 99% of the initial luminance.

Comparative Example

Figure 8:
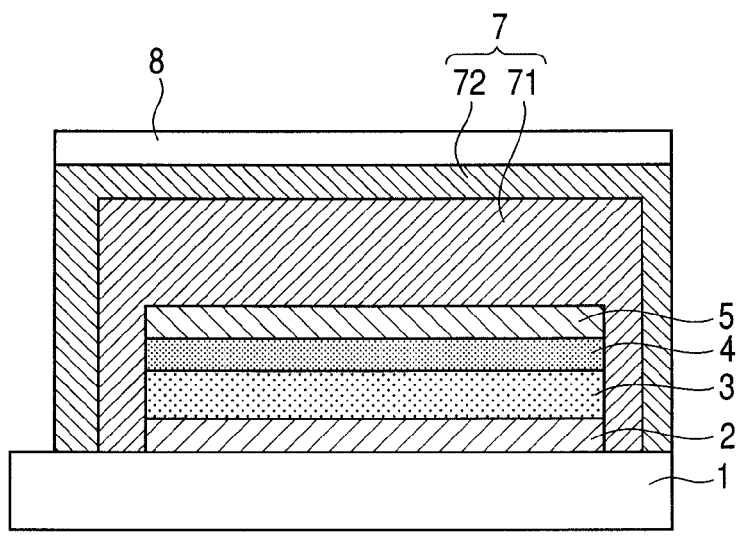
FIG. 8 is a sectional view schematically illustrating an organic EL device of Comparative Example.

In Comparative Example, an organic EL device shown in FIG. 8 which did not use the first passivation layer 6 was produced. The reference numerals in the figure are identical to those of FIGS. 5 and 6.

The same substrate 1 as that of Example 1 was used, and a process commencing on vacuum baking to ending on the formation of the upper electrode 5 was the same as that of Example 1.

The substrate was conveyed to a plasma CVD chamber without the formation of the first passivation layer 6.

Then, a monosilane gas, a nitrous oxide gas, a nitrogen gas, and a hydrogen gas were flowed so that the pressure of a space where a reaction was performed was controlled to 100 Pa. Next, 60-MHz high-frequency power was supplied to a high-frequency electrode, and the first layer 71 of the second passivation layer 7 formed of a silicon oxide nitride film having a thickness of about 2 μm was deposited and formed.

Then, a monosilane gas, a nitrogen gas, a hydrogen gas were flowed so that the pressure at which the film was formed was controlled to 100 Pa, and the second layer 72 of the second passivation layer 7 formed of a silicon nitride film having a thickness of about 1 μm was deposited and formed by a plasma CVD method.

The circularly polarizing plate 8 was bonded onto the second passivation layer 7.

The devices were each evaluated for the generation of voids with an optical microscope in the same manner as in Example 1.

The maximum void size was about 20 μm, and the number of voids reached 38. In addition, a film splintered to be peeled at some of the generated voids.

The number of voids increased by twice as compared to that in the case where the first passivation layer 6 was formed on the upper electrode.

The device was caused to emit light so as to be examined for dark spots. As a result, the 38 void portions each served as a dark spot having a size of 3 μm or more.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-220813, filed Aug. 28, 2007, which is hereby incorporated by reference herein in its entirety.

What is claimed is:

1. An organic electroluminescence device comprising:
a substrate;
a lower electrode;
an organic compound layer containing one of an alkali metal and an alkali metal compound;
an upper electrode formed of an oxide film; and
passivation layers for covering the lower electrode, the organic compound layer and the upper electrode,
wherein the passivation layers comprise:
a first passivation layer formed on the upper electrode, which contains silicon as a main component and which is free of hydrogen; and
a second passivation layer formed on the first passivation layer which contains silicon as a main component and hydrogen.

2. The organic electroluminescence device according to claim 1, wherein the first passivation layer comprises one or more insulating films each formed of one of an oxide, a nitride and an oxynitride.

3. The organic electroluminescence device according to claim 1, wherein one of the alkali metal and the alkali metal compound comprises one of cesium and a cesium compound.

4. The organic electroluminescence device according to claim 3, wherein the cesium compound comprises at least one selected from the group consisting of cesium carbonate, a substance derived from cesium carbonate and a coordination compound in which cesium coordinates with an organic compound in the organic compound layer.

* * * * *